(12) United States Patent
Stulrajter

(10) Patent No.: US 10,353,003 B2
(45) Date of Patent: Jul. 16, 2019

(54) APPARATUS AND METHOD FOR DETERMINING IMPEDANCE CHARACTERISTICS OF AN ELECTRICAL LOAD

(71) Applicant: Marek Stulrajter, Zillina (SK)

(72) Inventor: Marek Stulrajter, Zillina (SK)

(73) Assignee: NXP USA, Inc., Austin, TX (US)

( * ) Notice: Subject to any disclaimer, the term of this patent is extended or adjusted under 35 U.S.C. 154(b) by 658 days.

(21) Appl. No.: 14/905,203

(22) PCT Filed: Jul. 18, 2013

(86) PCT No.: PCT/IB2013/055911
§ 371 (c)(1),
(2) Date: Jan. 14, 2016

(87) PCT Pub. No.: WO2015/008113
PCT Pub. Date: Jan. 22, 2015

(65) Prior Publication Data
US 2016/0161562 A1    Jun. 9, 2016

(51) Int. Cl.
*G01R 31/34* (2006.01)
*G01R 27/02* (2006.01)
(Continued)

(52) U.S. Cl.
CPC .......... *G01R 31/343* (2013.01); *G01R 25/00* (2013.01); *G01R 27/02* (2013.01); *G01R 27/08* (2013.01); *G01R 27/14* (2013.01)

(58) Field of Classification Search
CPC ...... G01R 31/343; G01R 27/14; G01R 27/08; G01R 27/02; G01R 25/00
(Continued)

(56) References Cited

U.S. PATENT DOCUMENTS 6,366,865 B1    4/2002  Chalupa et al.
6,581,016 B1 *  6/2003  Yukawa ............... G01R 27/02
                                                        324/600
(Continued)

FOREIGN PATENT DOCUMENTS

CN          1248325 A      3/2000
CN       101650390 A      2/2010
(Continued)

OTHER PUBLICATIONS

Rasmussen et al, "Parameter estimation of inverter and motor model at standstill using measured currents only", Proceedings of the IEEE International Symposium on Industrial Electronics, Jun. 17-20, 1996, pp. 331-336, vol. 1.
(Continued)

*Primary Examiner* — Melissa J Koval
*Assistant Examiner* — Trung Nguyen

(57) ABSTRACT

Apparatus (103) suitable for determining the resistance and inductance of an electric motor (101) estimates the phase shift between a voltage applied to the motor and motor current. Estimation of the phase shift employs a heterodyne technique. The measured motor current is conditioned prior to heterodyning in a mixer 203 in order to reduce the effects of nonlinearities introduced by a voltage source inverter (102) which supplies the motor (101) with a voltage. A value for impedance may be calculated as a ratio of a voltage applied to the motor and the motor current. The resistance and inductance may then be calculated from the impedance and phase shift calculations. In cases where the voltage applied to the motor cannot be directly measured but only the voltage supply to the voltage source inverter 102 is known, a value for impedance may be determined based on a ratio of a reconstructed voltage signal having a phase angle equal to that of the motor current and the motor current.

15 Claims, 7 Drawing Sheets

(51) Int. Cl.
*G01R 25/00* (2006.01)
*G01R 27/08* (2006.01)
*G01R 27/14* (2006.01)

(58) Field of Classification Search
USPC ....... 324/600, 650, 500, 521, 617, 622, 683, 324/709, 76.11, 76.52–76.77, 138; 702/60, 69, 106; 320/109–126, 160
See application file for complete search history.

(56) References Cited

U.S. PATENT DOCUMENTS

| | | | |
|---|---|---|---|
| 2009/0230980 A1* | 9/2009 | Williams | G01R 27/32 324/707 |
| 2012/0194113 A1 | 8/2012 | Lee et al. | |

FOREIGN PATENT DOCUMENTS

| | | |
|---|---|---|
| CN | 102386835 | 3/2012 |
| CN | 102714480 A | 10/2012 |
| EP | 2582036 A2 | 4/2013 |
| JP | 2010035363 | 2/2010 |
| JP | 2011193563 | 9/2011 |
| KR | 20000007243 | 2/2000 |
| KR | 20120088961 | 8/2012 |
| KR | 20130039613 | 4/2013 |

OTHER PUBLICATIONS

Musak, Parameter estimation of an electric servo-drive with PMSM, Diploma work, 2012, University of Zilina, Slovakia (attachment is in the Slovak language).
International Search Report for International application No. PCT/IB2013/055911 dated Apr. 22, 2014.

* cited by examiner

APPARATUS AND METHOD FOR DETERMINING IMPEDANCE CHARACTERISTICS OF AN ELECTRICAL LOAD

FIELD OF THE INVENTION

This invention relates to an apparatus and method for determining impedance characteristics of an electrical load and has particular application to the determination of the resistance and inductance of an electric motor including a coil winding.

BACKGROUND OF THE INVENTION

The determination or estimation of electric load parameters, such as a phase angle (or phase shift) between a voltage supplied to the load and the resultant current flowing through it, the load impedance and its constituent real and imaginary components, for example, is useful to the designer and user of such equipment. In the case of an electrical load comprising an electric motor, common electric motor drive systems typically comprise an electric motor (essentially consisting of a wound coil), a voltage supply source for the motor and a control unit. The voltage supply source often comprises a voltage source inverter for providing an AC supply from an external DC supply. The overall circuit resistance of an electric motor drive system may be considered to consist of the coil resistance, resistance of any interconnecting cables and resistance attributable to the inverter. This latter contribution is due to components such as transistors and shunt resistors. For some applications (for example, high-voltage with low current) the resistance of the cables and inverter are negligible compared with that of the coil. However, for low-voltage applications (for example, 12 or 24 volts supply in automotive vehicle applications) the coil resistance might be so small that the sum of parasite resistances from the inverter and supply cables becomes a significant part of the overall circuit resistance. While the electrical circuit resistance of an electric motor drive system can be affected by the voltage source inverter, variation in inductance is influenced by magnetic field conditions and therefore by the current flowing through the coil. Thus, inductance can vary depending on the operational conditions of the motor. A common approach for determining the resistance and inductance of an electric motor relies on knowledge of the circuit supply voltage and the current flowing. For example, measuring an applied DC voltage and the DC current flowing yields a value for resistance. Measuring an applied AC voltage and AC current flowing yields a value for impedance. Knowing impedance and resistance enables the reactance/inductance to be calculated. However, many electric motor drive systems do not have the capability to measure the real phase voltage applied to the electric motor, which is a limiting factor for precise measurement of the electrical motor parameters. CN 102386835 discloses a method utilising measurements of AC voltage and AC current. US20120194113 describes a method for estimating inductance of a motor. This has the disadvantage that the estimation can only be carried out while the motor is running. U.S. Pat. No. 6,366,865 discloses a method for estimating coil resistance. Hence, known methods require a two-step process in order to estimate resistance and inductance.

SUMMARY OF THE INVENTION

The present invention provides an apparatus and method for determining impedance characteristics of an electrical load as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
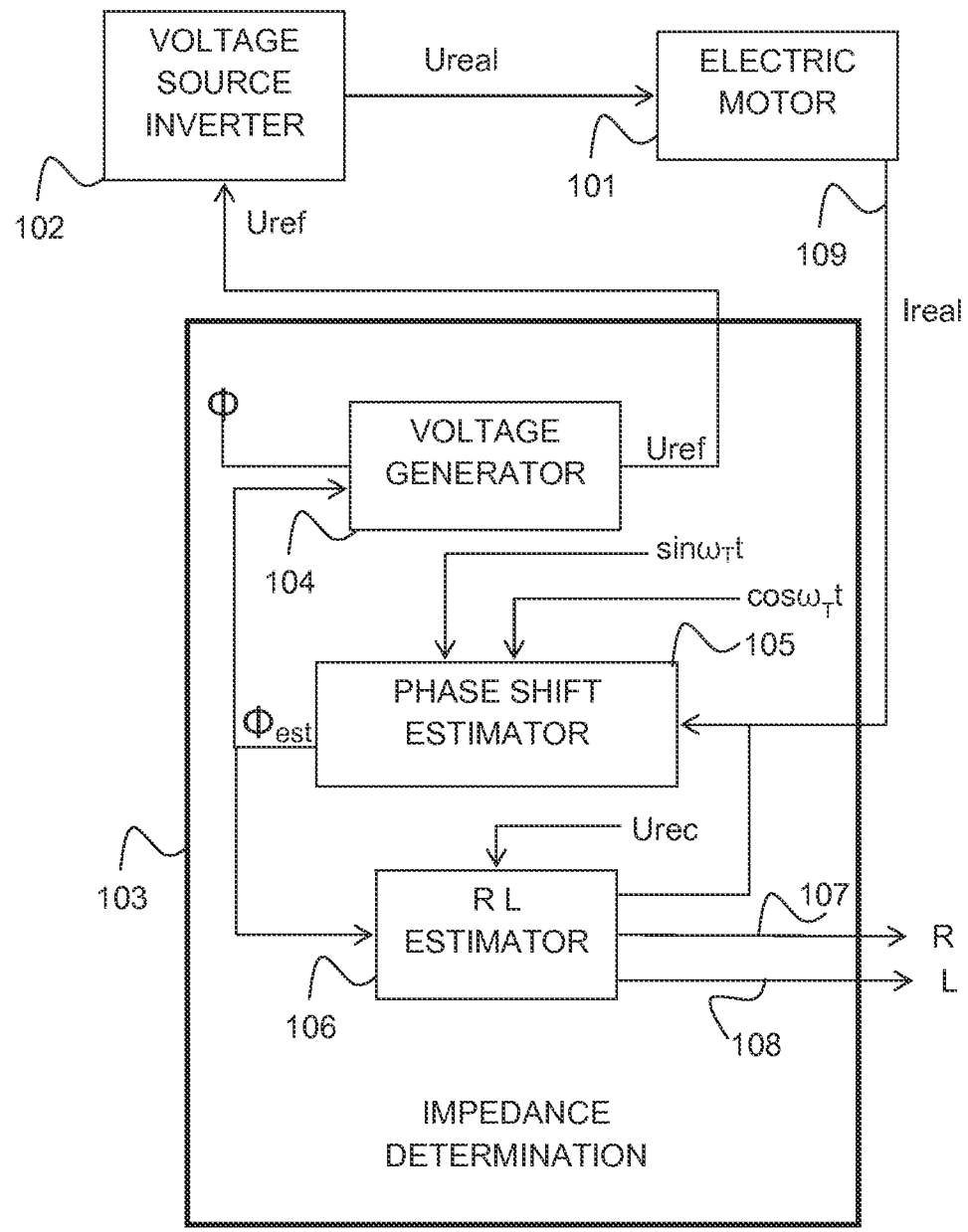
FIG. 1 is a simplified block diagram of an example of an embodiment of an electric motor drive system including apparatus for determining impedance characteristics of an electrical load.

With reference to FIG. 1, an electric motor drive system may comprise an electrical load comprising an electric motor 101 (which may include a wound coil) and a voltage source inverter 102 for providing a voltage source Ureal to the electric motor 101. Apparatus for determining the impedance of the electric motor 101 may comprise an impedance determination module 103 which may be operably coupled to the electric motor 101 and to the voltage source inverter 102. The impedance determination module 103 may include a voltage generator 104 for generating a reference voltage Uref for application to the voltage source inverter 102 as a control signal. The impedance determination module 103 may comprise a phase shift estimator 105 and a resistance and inductance (RL) estimator 106. The phase shift module 105 may receive the current Ireal which flows through the motor when the reference voltage Uref is applied. The impedance determination module 103 may be arranged to determine an impedance, Z, and outputs of the impedance determination module on lines 107 108 may provide estimates of the resistance and inductance of an electrical circuit comprising the motor 101.

The electric motor 101 may, be for example, a permanent magnet synchronous motor (PMSM). In other examples, however, the electric motor 101 may comprise an electric machine or electro-mechanical device such as a transformer, DC motor or generator, AC motors or generator, linear motor, electromagnet or actuator).

A typical electric motor 101 contains a permanent magnet, a rotor and a wound coil which is characterised by a resistance R and inductance L. A terminal voltage $U_{real}$ supplied by the voltage source inverter 102 may feed the coil and cause a current $I_{real}$ to flow through the coil which consequently, generates an electromagnetic field and a resulting torque. When it is rotating, the rotor generates an induced voltage which tends to reduce the supply voltage. This effectively means that the full supply voltage is not actually energising the RL circuit. On the other hand, when the rotor is stationary, there is no induced voltage and the full supply voltage feeds the RL circuit. The general voltage equation of a permanent magnet motor with a stationary rotor is then simplified to:

$$U_S = RI + L\frac{dI}{dt}$$

Hence, methods for determining RL characteristics when the rotor is at a standstill, such as those in accordance with embodiments of the invention described herein are advantageous. A further advantage of the invention is that only a measurement of current through the electric motor is required as will be explained in greater detail below. Also advantageously, the invention may provide a method for simultaneous determination of resistance and inductance of an electrical load which may comprise an electric motor 101.

A voltage source inverter 102 may be used for control of the power applied to the electric motor 101. For most common 3-phase motors a 3-phase H-bridge inverter may be used. In order to protect the power switches (transistors) in the particular phase leg a dead-time may be introduced into the switching patterns. Dead-time avoids switch-on of both transistors in complementary mode and any creation of a short circuit. However, introducing this dead-time into the switching states may bring nonlinearities into the generated voltage waveforms. Due to the dead-time, the reference inverter voltage, which may be known, does not actually equal the output inverter voltage.

The voltage generator 104 of the impedance determination module 103 may be arranged to generate a reference voltage for application to the voltage source inverter 102. The reference voltage Uref can be described as follows:

$$U_{ref} = U_{DC} + U_m \sin(\omega_T t)$$

where $U_{DC}$ represents a DC offset, $U_m$ is the magnitude of a test voltage signal generated in the voltage generator module 104 and $\omega_T$ represents the (angular) frequency of the test signal. Adding an adjustable offset to an AC excitation voltage may assist in acquiring current-dependant inductance characteristics The phase shift estimator 105 may be arranged to estimate a real voltage-current phase shift (or phase angle) based on the real current feedback from the electric motor 101 on line 109 and an auxiliary voltage signal.

The RL estimator 106 may be arranged to determine values for resistance and inductance that may be based on an estimated phase-shift, real current feedback and a reconstructed voltage signal.

In one example embodiment, a DC component of the reference voltage Uref may be manually swept from $-U_{dc}$ (that reflects a current of nominal value $-I_N$) to $+U_{dc}$ (that generates a current $+I_N$). This measure is advantageous in the case of a PMSM motor as it takes into account the current-dependent inductance characteristics thereof.

In one embodiment, the voltage generator 104 may be arranged (in a feed-forward path) to set a test voltage signal frequency based on a preset phase shift and an estimated phase-shift between the voltage applied to the electric motor drive system and the current flowing therein. Alternatively, the frequency of the test voltage signal may be set manually.

Figure 2:
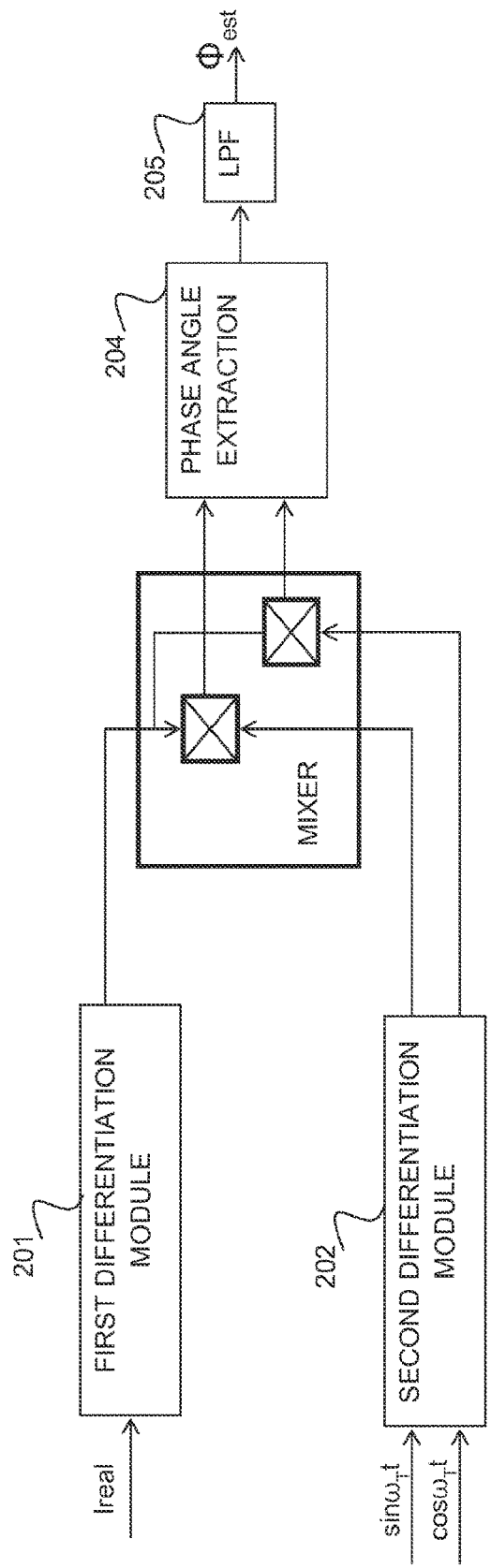
FIG. 2 is a simplified block diagram of an example embodiment of apparatus for determining a phase angle of a current flowing in an electrical load.

The phase shift estimator 105 will now be described in greater detail with reference FIG. 2. Inputs to the phase shift estimator module 105 may comprise the current (Ireal) flowing through the electric motor 101 and an auxiliary signal having the same frequency as the current Ireal. In one example embodiment, the phase shift estimator module 105 may be arranged to estimate a real phase shift between a voltage waveform applied to the motor terminals and a current flowing through the electric motor 101 in the case where the real voltage cannot be measured and only knowledge of a reference voltage can be used. In practice, a phase shift co/may exist found between a real terminal voltage and the real current. The same phase shift can be also observed between the reference voltage and an "ideal" current. Ideal current $I_{IDEAL}$ is a fictitious current and represents the current flowing when there are no inverter nonlinearities to influence it. Both the ideal current and the reference voltage waveforms are out of phase due to the error $\varphi_{err}$ caused by inverter The phase angle (or phase shift) $\varphi_{est}$ between the reference voltage and the real current is strongly affected by $\varphi_{err}$ and can cause a significant error in the phase shift estimation.

In order to mitigate the negative impact of the inverter nonlinearities on the current waveform, the real current signal may be differentiated in a first differentiation module 201 in the phase shift estimation module 105. The phase shift estimation module 105 may further comprise a second differentiation module 202 which may be arranged to differentiate an auxiliary voltage signal. The auxiliary voltage signal may comprise sine and cosine components and may have the same frequency as the load current and reference voltage Uref. The auxiliary voltage signal may be generated in the impedance determination module 103.

In one example embodiment, say that the real voltage Ureal cannot be measured and only Uref and Ireal are known. Consider the following relationships:

$$U_{REF} = U_m \sin(\omega_T t)$$

$$U_{REAL} = U_m \sin(\omega_T t) \pm U_{DT\_DROP}$$

$$I_{REAL} = \frac{U_{REAL}}{Z} = I_m \sin(\omega_T t - \varphi_l) \pm I_{DT\_DROP}$$

$$I_{IDEAL} = \frac{U_{REF}}{Z} = I_m \sin(\omega_T t - \varphi_l)$$

Differentiating the expressions for Uref, Ireal and Iideal, yields:

$$U'_{REF} = \frac{1}{\omega_T} \frac{dU_{REF}}{dt} = U_m \cos(\omega_T t)$$

and:

$$I'_{REAL} = \frac{1}{\omega_T} \frac{dI_{REAL}}{dt} = I_m \cos(\omega_T t - \varphi_1)$$

and:

$$I'_{IDEAL} = \frac{1}{\omega_T} \frac{dI_{IDEAL}}{dt} = I_m \cos(\omega_T t - \varphi_1)$$

The above expression for Ureal describes the real voltage that contains a DC component $U_{DT\_DROP}$ reflecting the voltage drop caused by the dead-time of the voltage source inverter 102. The polarity of this voltage drop is linked with the polarity of the load current. Consequently the voltage step changes may lead to exponential changes of the current. The steady state of the current changes can be expressed as a DC component $I_{DT\_DROP}$. The differentiation process may cancel the DC component and so the derivative real current $I'_{REAL}$ of the real current becomes almost identical to the ideal current. Although transient current changes may not be completely eliminated by the differentiation process, they are phase shifted and may be observed in the peaks zero. Further, the estimated phase shift (or angle) $\varphi_{est}$ between the reference voltage Uref and the derivative of the real current relates to a real phase shift $\varphi_1$.

A mixer module 203 may receive outputs from each of the first and second differentiation modules 201, 202. In the mixer 203, a method based on the known heterodyne technique may be used for removing the phase shift from the differentiated current signal. Thus, sine and cosine components of the derivative of the auxiliary signal may each be mixed with the derivative of the real current flowing in the electric motor. That is to say that the inputs to the mixer can be expressed as:

$$U'_\alpha = \cos(\omega_T t)$$

$$U'_\beta = -\sin(\omega_T t)$$

$$I'_{REAL} = I_m \cos(\omega_T t - \varphi_1)$$

Thus, the mixer 203 may heterodyne a current signal which contains information of a phase shift with an auxiliary voltage vector, which in this example is represented by sine and cosine components. The current signal may have a known frequency but an unknown phase shift. The auxiliary sine and cosine signals may have the same frequency as the reference voltage signal Uref (and the current signal) yet have no phase shift. Both components of the auxiliary voltage signal may have the same magnitude (which is unity in this example). The differentiation of Ireal prior to heterodyning can introduce a certain phase error. To eliminate this phase error (or lag), the same differentiation process is performed on the other inputs to the phase shift estimation module 105 prior to heterodyning. Then the resulting phase shift which may be output from mixer 203 may not be affected by any phase errors caused by the differentiation process. The auxiliary voltage signals may be generated in the voltage generator 104, for example.

The outputs of the mixer 203 comprising the heterodyned components (which may be thought of as quasi-power signals $P_\alpha, P_\beta$), may be represented by the following two expressions:

$$P_\alpha = \frac{I_m}{2} \sin(\varphi_1) + \frac{I_m}{2} \sin(2\omega_T t - \varphi_1)$$

and:

$$P_\beta = \frac{I_m}{2} \cos(\varphi_1) + \frac{I_m}{2} \cos(2\omega_T t - \varphi_1)$$

The first term of each of the above expressions represents the difference of the input mixer frequencies and therefore behaves as a DC component and is only phase shift dependent. This term contains information about the current signal Ireal phase shift. The second term represents the sum of input mixer frequencies and may be considered as an unwanted component and may be filtered out. The wanted signals which are output from the mixer 203 may then be input into a phase angle extraction module 204 which in this example may comprise an arctangent function having two arguments. A raw form of an estimated phase shift may be written as:

$$\varphi_{est\_raw} = a \tan 2(P_\beta, P_\alpha)$$

An output of the arctangent function module 204 may then be represented by the expression:

$$\varphi_{est\_raw} = \varphi_1 + \theta_{2f_T}$$

The output of the arctangent function module 204 may consist of two components. These two components may be the appropriate outputs of the mixer 203 transformed into an angle representation. The first component of the above expression for a raw form of an estimated phase shift is a DC component and corresponds to the real phase shift of the current signal Ireal. The second component represents an angle of a vector which is rotating at double the frequency of the test signal. In order to extract the required phase shift value, the output of the arctangent function module 204 may be passed through a filter 205 which may be a numerical low pass filter. Hence the estimated value of the desired phase shift after low pass filtering is:

$$\varphi_{est} = \varphi_1$$

It will be noted that any phase shift introduced by the low pass filter 205 is not critical. However, a second order low pass filter may be used rather than a first order low pass filter in order to ensure successful extraction of the DC component whilst attenuating all frequencies introduced by the test signal and heterodyning signal process.

Figure 3:
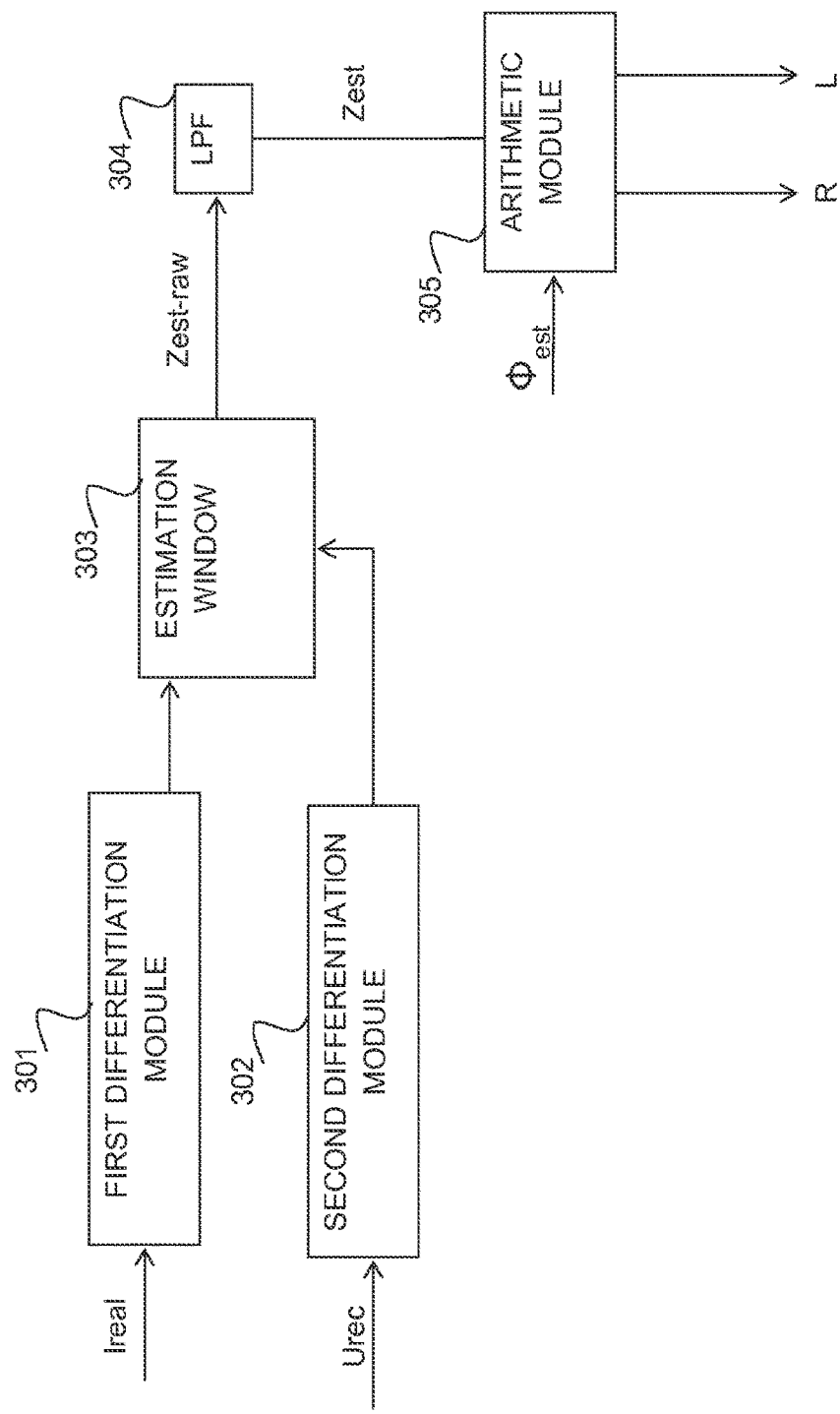
FIG. 3 is a simplified block diagram of a first example embodiment for determining an impedance of an electrical load.

The RL estimator 106 will now be described in greater detail with reference to FIG. 3. Inputs to the RL estimator 106 may comprise the current (Ireal) flowing through the electric motor 101 and a voltage signal (reconstructed voltage signal, Urec). Urec may have the same frequency as the reference voltage Uref. Urec may have the same amplitude as Uref. Urec may have the same phase as Ireal and so may comprise the reference voltage Uref phase-shifted by the phase shift which has been estimated by the phase shift estimator 105. The reconstructed voltage signal Urec may be generated in the impedance derivation module 103.

The RL estimator 106 may determine the real and imaginary components of the impedance of the electrical circuit incorporating the electric motor 101 from the current Ireal flowing through the electric motor and received by the impedance determination module 103, the estimated phase shift and a reconstructed voltage which may be generated in the impedance determination module 103 based on the estimated phase shift.

The reference voltage Uref as well as the real voltage Ureal will be of phase with the current Ireal. However, by knowing the current phase shift (as previously determined in the phase shift estimator 105) it is possible to create a signal that will be in phase with the current Ireal. Hence the impedance determination module 103 may be further arranged (in the voltage generator 104, for example) to generate a reconstructed voltage signal Urec that is in phase with the current Ireal. In one embodiment, the magnitude of the reconstructed voltage may be the same as that of the reference voltage. Hence, the reconstructed voltage may be arranged to be proportional to the current and this proportion may be equivalent to the circuit impedance according to the expression:

$$Z = \frac{U_{rec}}{I_{real}} = \frac{U_m \sin(\omega_T t - \varphi_{est})}{I_m \sin(\omega_T t - \varphi_I)}$$

Assuming that $\varphi_{est} = \varphi_I$ the above expression for Z can be simplified to:

$$Z = \frac{U_{rec}}{I_{real}} \approx \frac{U_m}{I_m}$$

However, as it is has been mentioned above, the nonlinearities of the voltage source inverter 102 deform the current signal in magnitude. In order to compensate for this, the current Ireal is differentiated in a first differentiation module 301 in order to mitigate the negative effects of inverter dead-time. In order to keep the differentiated current signal in phase with the reconstructed signal, the reconstructed voltage $U_{rec}$ is also differentiated in a second differentiation module 302. Then, an estimated raw value for impedance may be calculated according to the following expression:

$$Z_{est\_raw} = \frac{\frac{1}{\omega_T} U'_{rec}}{\frac{1}{\omega_T} I'_{real}} = \frac{U_m \cos(\omega_T t - \varphi_{est})}{I_m \cos(\omega_T t - \varphi_I)} \approx \frac{U_m}{I_m}$$

The above expression for the estimated raw value for impedance assumes ideal signal waveforms. However, the differentiation in the modules 301 and 302 may eliminate only the steady state of the current changes introduced by inverter dead-time. On the other hand, the current changes transients caused by dead-time may not be entirely eliminated but shifted 90 degrees out of phase with the differentiated signal. This phenomenon causes a deviation of the current waveform in magnitude. Hence this expression for estimated raw value for impedance may not be employed for every instant sample of the differentiated current and voltage. This drawback may be overcome by the use of an estimation window module 303 whose inputs are connected to the outputs of the first and second differentiation modules 301, 302. An "estimation window" may be defined as an area within one period of the test signal, $U_m \sin(\varphi_T t)$ where the effect of the inverter dead-time is suppressed by differentiation. During this time, the above expression for the estimated raw value for impedance is valid. Hence the division of the derivatives may be performed during a period when any non-linear effects of the voltage source inverter are at a minimum. The estimation window may be defined as a sum of several conditions as follows:

Firstly, U'$_{rec}$ and U$_{ref}$ must have opposite sign (opposite polarity);

Secondly, An absolute value of U$_{ref}$ must be higher than a threshold x % of U$_m$;

Thirdly, An absolute value of U'$_{rec}$ must be higher than a threshold x % of U$_m$.

By summing these conditions the estimation window may be defined as follows:

if (U'$_{rec}$U$_{ref}$<0) && if (|U'$_{rec}$|>x% U$_m$) && if (|U$_{ref}$|>x% U$_m$) then ENABLE By applying these conditions, an estimation window may be defined immediately before a new dead-time transient occurs. This is a moment when the derivative of real current is equivalent to the derivative of ideal current.

The resulting value for the estimated raw value of impedance $Z_{est\_raw}$ may be filtered by a filter 304. The filter 304 may be a low pass filter and in one embodiment may be a first order low pass filter. The output of this filter 304 may then represent an estimated value of the impedance $Z_{est}$ of the circuit including the electric motor 101.

The output of the filter 304 may be fed to an arithmetic module 305. The arithmetic module 304 may be arranged to estimate the resistance R and the inductance L components of the estimated impedance $Z_{est}$ by using the estimated value of $Z_{est}$ and the estimated phase shift (or angle) $\varphi_{est}$ in the following expressions:

$$R_{est} = Z_{est} \cos(\varphi_{est})$$

$$L_{est} = \frac{1}{\omega_T} Z_{est} \sin(\varphi_{est})$$

Figure 4:
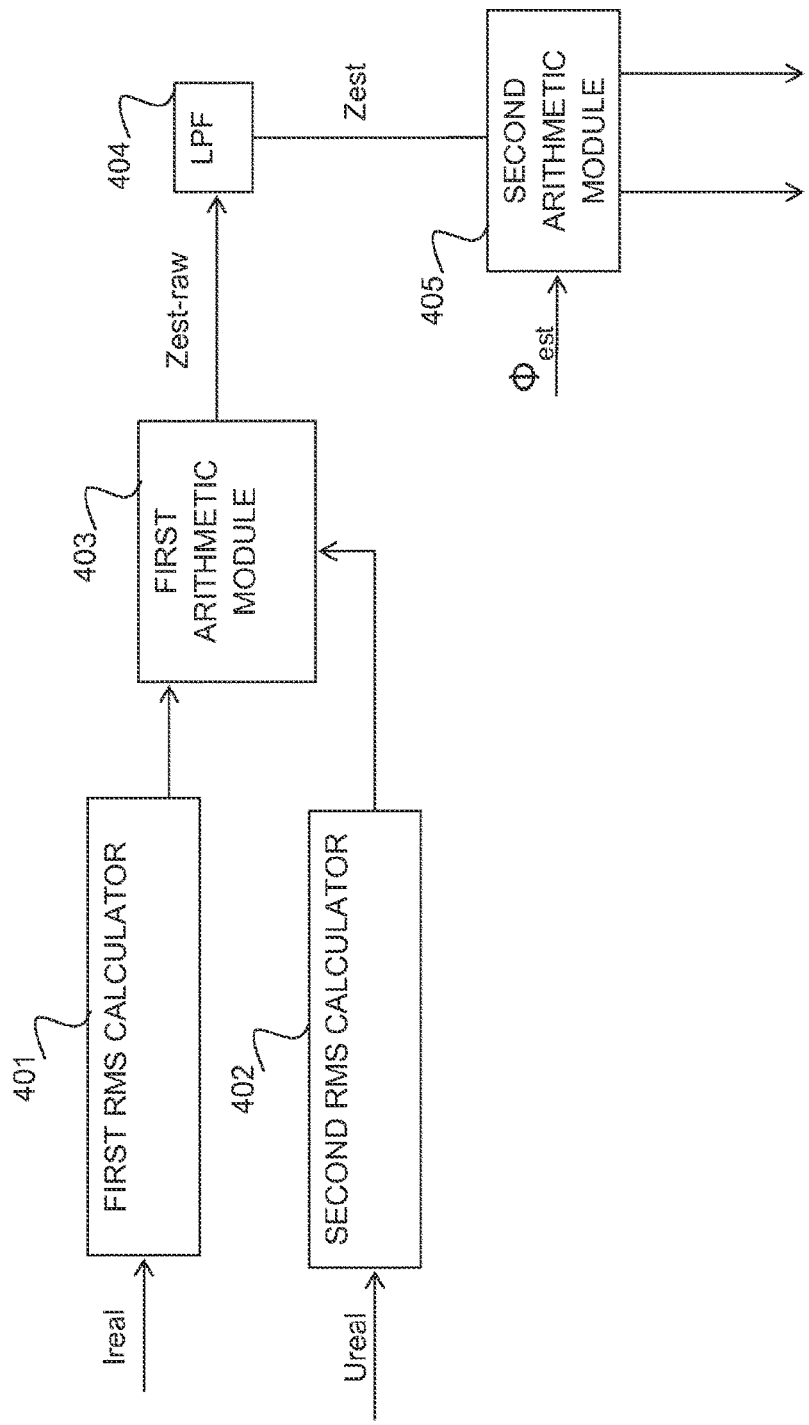
FIG. 4 is a simplified block diagram of a second example embodiment for determining an impedance of an electrical load.

In an alternative embodiment where the real voltage Ureal being applied to the motor terminals can be measured, the RL estimator 106 may be configured as illustrated in FIG. 4 instead of as shown and described with reference to FIG. 3. In this alternative case, the impedance determination module 103 may be arranged to receive a measurement of the real voltage Ureal or may, alternatively, be arranged to make the measurement itself. Referring then to FIG. 4, an RMS value of real current $I_{RMS}$ may be calculated in a first RMS calculator 401. An RMS value of real voltage $U_{RMS}$ may also be calculated in a second RMS calculator 402. Outputs of each first and second RMS calculators 401, 402 may be fed to a first arithmetic module 403 which may be arranged to divide the RMS voltage by the RMS current to give an estimated value for impedance. An output of the first arithmetic module 403 may be passed through a low pass filter 404 in order to produce a filtered estimate of impedance $Z_{est}$. The output of the low pass filter 304 may be fed to a second arithmetic module 405. The second arithmetic module 405 may be arranged to estimate the resistance R and the inductance L components of the estimated impedance $Z_{est}$ by using the estimated value of $Z_{est}$ and the estimated phase shift (or angle $\varphi_{est}$ in the following expressions:

$$R_{est} = Z_{est} \cos(\varphi_{est})$$

$$L_{est} = \frac{1}{\omega_T} Z_{est} \sin(\varphi_{est})$$

In a further embodiment, the voltage source inverter 102 or the voltage generator 104, for example, may be arranged to add or subtract a certain amount of DC voltage to or from the voltage required by the electric motor 101 (depending on the polarity of the current). This measure may compensate for voltage source inverter dead time and therefore the real voltage will be equal to the reference voltage. In such a case, since the real voltage will not contain any voltage step changes, the current through the electric motor will be more sinusoidal and is less likely to have any DC offsets or other nonlinearities.

Figure 5:
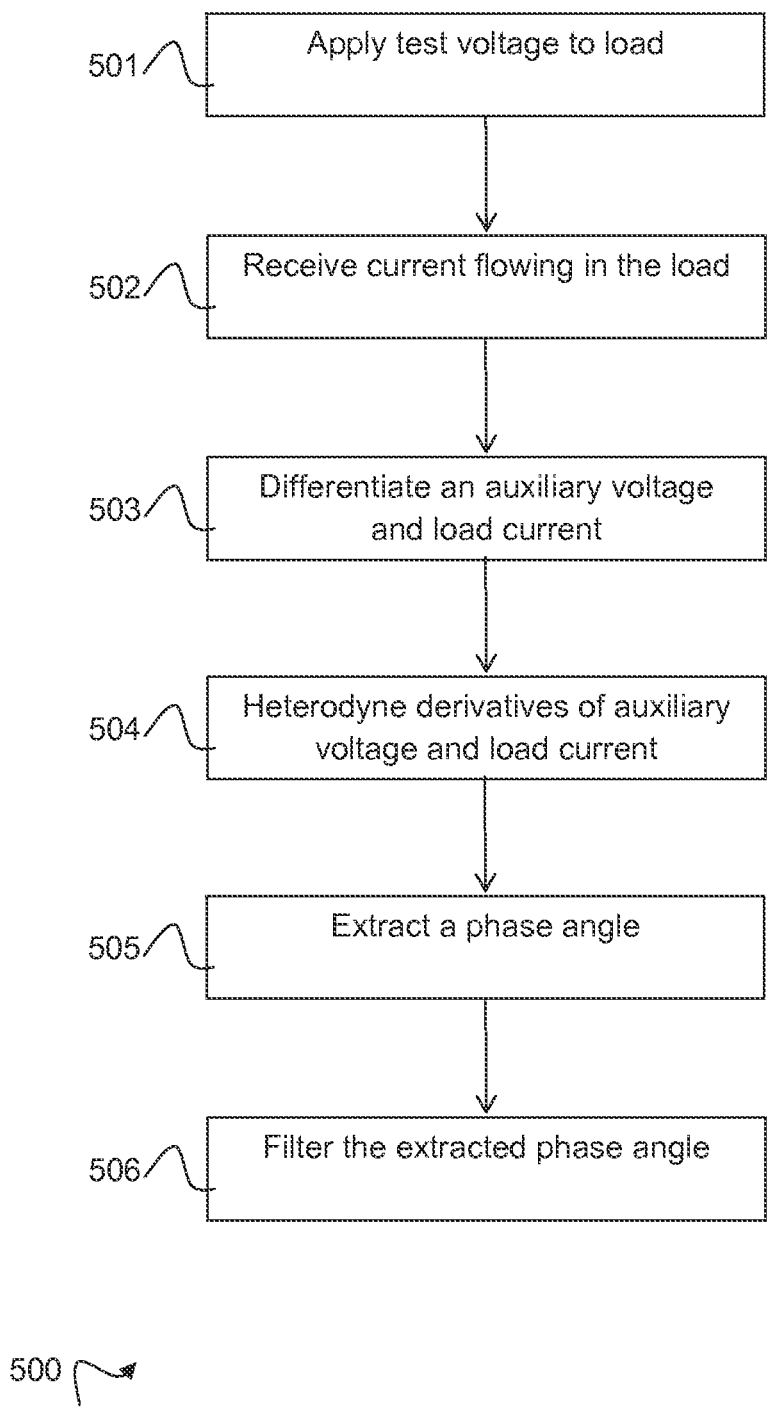
FIG. 5 is a simplified flowchart of a first exemplary method for determining a phase angle of a current flowing in an electrical load.

An example of a method 500 for determining a phase angle of a current flowing in an electrical load will now be described with reference to the flowchart of FIG. 5. At 501, a test voltage may be applied to the electrical load. In an alternative arrangement a test voltage may be applied to a voltage source inverter which in turn may supply the electrical load. The test voltage may include an AC signal of known amplitude and frequency. The test voltage may include a DC component.

At 502, a current (load current) flowing through the load as a result of the applied test voltage may be received for processing.

At 503, an AC auxiliary voltage signal having the same frequency as the test voltage (and load current) and the load current may both be differentiated to produce respective derivative signals.

At 504, the derivative signals may be mixed using a heterodyne process,

At 505, a load current phase angle signal may be extracted from the products of the heterodyne process.

At 506, the load current phase angle signal may be filtered to produce a filtered load current phase angle estimation.

Figure 6:
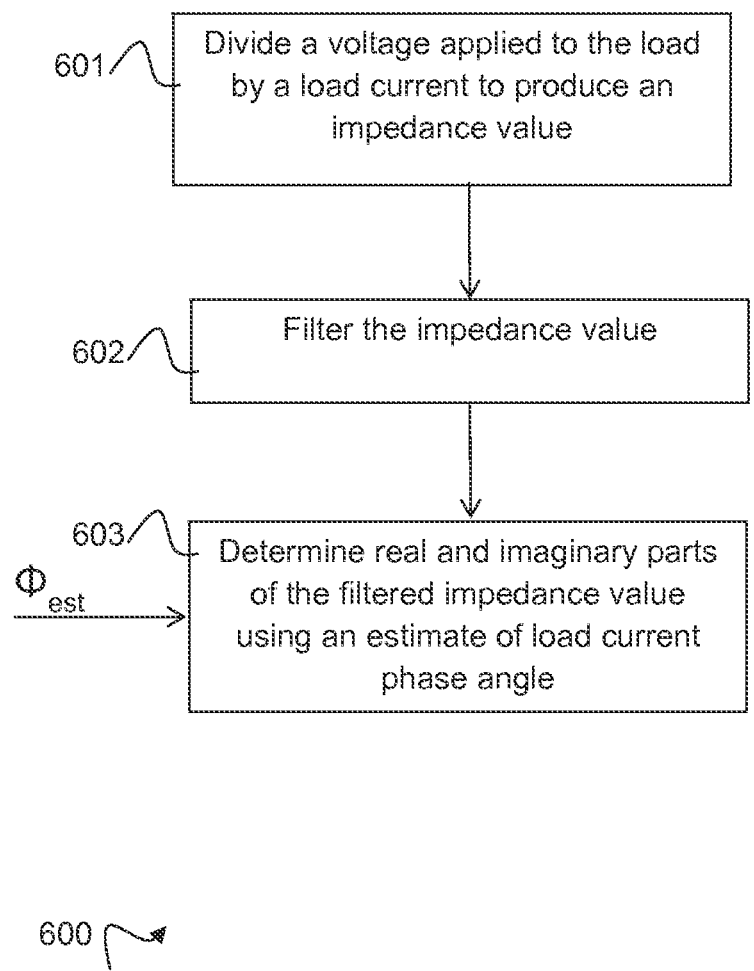
FIG. 6 is a simplified flowchart of a first exemplary method for determining real and imaginary components of an impedance of an electrical load.

A first exemplary method 600 for determining real and imaginary components of the impedance of an electrical load using the estimate of load current phase angle determined from the method described with reference to FIG. 5, will now be described with reference to the flowchart of FIG. 6. At 601, a value of a voltage applied to the load may be divided by a value of the load current to produce an impedance value. In one example, the value of the voltage applied to the load and the value of the load current may be root mean square (RMS) values.

At 602, the produced impedance value may be filtered to produce a filtered value of impedance.

At 603, the real and imaginary components of the impedance of the electrical load may be determined from the filtered value of the impedance and the estimated load current phase angle.

Figure 7:
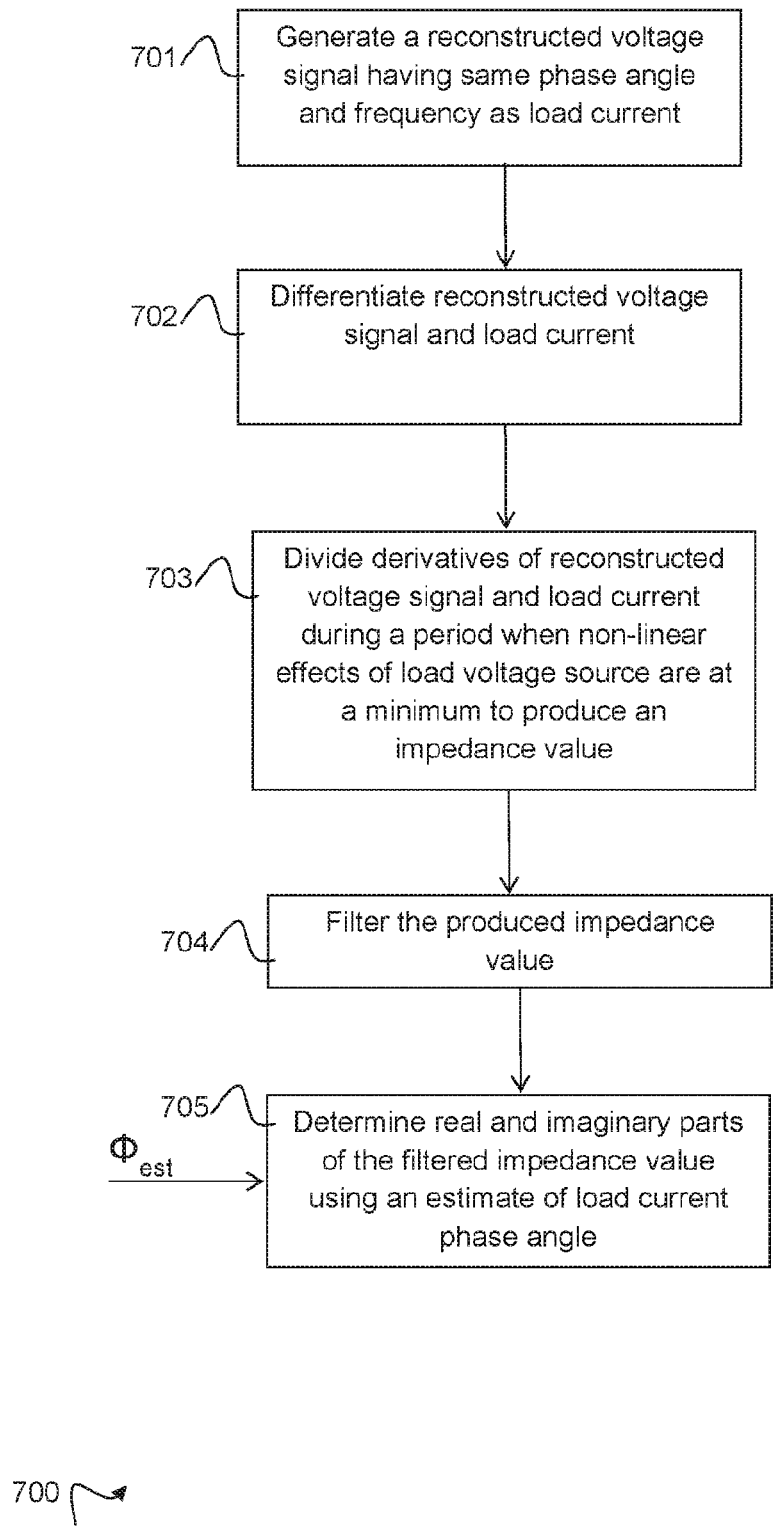
FIG. 7 is a simplified flowchart of a second exemplary method for determining real and imaginary components of an impedance of an electrical load.

A second exemplary method 700 for determining real and imaginary components of the impedance of an electrical load using the estimates of load current phase angle determined from the method described with reference to FIG. 5, will now be described with reference to the flowchart of FIG. 7. At 701, a reconstructed voltage signal may be generated which has the same phase and frequency as the load current.

At 702, the reconstructed voltage signal and the load current may be differentiated to produce respective derivative signals.

At 703, the derivative of the reconstructed voltage may be divided by the derivative of the load current during a period when nonlinear effects of a voltage source (such as a voltage source inverter, for example) which supplies a test signal to the load, thereby generating the load current, are at a minimum to produce an impedance value.

At 704, the produced impedance value may be filtered to produce a filtered value of impedance.

At 705, the real and imaginary components of the impedance of the electrical load may be determined from the filtered value of the impedance and the estimated load current phase angle.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

As an example, a tangible computer program product may be provided having executable code stored therein to perform a method for determining impedance characteristics of an electrical load as described herein.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the functionality of the voltage generator 104, the phase shift estimator 105 and the RL estimator 106 modules of FIG. 1 may be integrated into a single module or distributed amongst more than one module. Furthermore, a method according to an example embodiment of the invention may be implemented in a microcontroller unit. Furthermore, said method may be a stand-alone method or may form part of an initial sequence of a motor control strategy. Embodiments of the invention may be implemented in systems equipped with an analogue to digital conversion module for current measurement and a pulse width modulation module for voltage generation.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the impedance determination module shown in FIG. 1 may be implemented in an integrated circuit That is to say that apparatus for determining impedance of an electrical load may be implemented in an integrated circuit. Such an integrated circuit may be a package containing one or more dies. Alternatively, the examples may be implemented as any number of separate integrated circuits or separate devices interconnected with each other in a suitable manner. For example, an integrated circuit device may comprise one or more dies in a single package with electronic components provided on the dies that form the modules and which are connectable to other components outside the package through suitable connections such as pins of the package and bondwires between the pins and the dies.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A method for determining impedance characteristics of an electrical load, the method comprising; applying a test voltage signal to the load, receiving a load current which flows in the load, differentiating the load current and an auxiliary voltage signal, said auxiliary voltage signal having the same frequency as the test voltage signal and zero phase shift, to produce derivative signals, heterodyning the derivative signals to produce heterodyned output signals, and extracting from the heterodyned output signals a phase angle between the derivative of the load current and the derivative of the auxiliary voltage signal which is equivalent to a phase shift between the test voltage signal applied to the load and the load current flowing in the load.

2. The method of claim 1 wherein the auxiliary voltage signal comprises sine and cosine components of equal magnitude and wherein the method comprises heterodyning a derivative of each of the sine and cosine components with the derivative of the load current.

3. The method of claim 1 wherein extracting the phase angle comprises determining an arctangent function of components of the heterodyned output signals.

4. The method of claim 1 further comprising determining an impedance value by dividing the test voltage applied to the load by the load current and determining real and imaginary parts of the impedance value from the determined impedance value and from the extracted phase angle.

5. The method of claim 1 further comprising generating a reconstructed voltage signal having the same phase angle and frequency as the test voltage signal and the load current, differentiating the reconstructed voltage signal and the load current to produce derivative signals, determining an impedance value by dividing the derivative of the reconstructed voltage signal by the derivative of the load current, determining real and imaginary parts of the impedance value from the determined impedance value and from the extracted phase angle.

6. The method of claim 5 further comprising determining the impedance value during a period when non-linear effects due to application of a voltage to the load are at a minimum.

7. An apparatus for determining impedance characteristics of an electrical load, the apparatus comprising; a first module arranged to apply a test voltage signal to the load and to generate an auxiliary voltage signal, said auxiliary voltage signal having the same frequency as the test voltage signal and zero phase shift, a second module arranged to receive a load current which flows in the load and to differentiate the load current and the auxiliary voltage signal to produce derivative signals, and to mix the derivative signals to produce heterodyned output signals, and to extract from the heterodyned output signals, a phase angle between the derivative of the load current and the derivative of the auxiliary voltage signal which is equivalent to a phase shift between the test voltage signal applied to the load and the load current flowing in the load.

8. The apparatus of claim 7 further comprising a second order low pass filter arranged to filter the extracted phase angle.

9. The apparatus of claim 7 wherein the second module is arranged to extract a phase angle by determining an arctangent function of components of the heterodyned output signals.

10. The apparatus of claim 7 comprising a first arithmetic module arranged to determine an impedance value from the test voltage signal applied to the load and the load current, and a second arithmetic module arranged to determine real and imaginary parts of the impedance value from the determined impedance value and from the extracted phase angle.

11. The apparatus of claim 7 wherein the first module is arranged to generate a reconstructed voltage signal having the same phase angle and frequency as the test voltage signal and the load current, and wherein the apparatus comprises a third module arranged to differentiate the reconstructed voltage signal and the load current to produce derivative signals and to determine an impedance value by dividing the derivative of the reconstructed voltage signal by the derivative of the load current, and an arithmetic module arranged to determine real and imaginary parts of the impedance value from the determined impedance value and from the extracted phase angle.

12. The apparatus of claim 11 further comprising a first order low pass filter for filtering the determined impedance value.

13. The apparatus of claim 11 wherein the third module is arranged to determine the impedance value during a period when non-linear effects due to application of a voltage to the load are at a minimum.

14. The apparatus of claim 7 wherein the apparatus is implemented in an integrated circuit.

15. A tangible computer program product having code executable by a computer system and stored in non-transitory media therein to perform a method for determining impedance characteristics of an electrical load in accordance with claim 1, wherein the impedance characteristics are determined only from a measurement of the load current.

* * * * *